United States Patent
Nomiya

(10) Patent No.: US 9,565,757 B2
(45) Date of Patent: Feb. 7, 2017

(54) ELECTRONIC COMPONENT AND MANUFACTURING METHOD THEREFOR

(71) Applicant: Murata Manufacturing Co., Ltd., Kyoto (JP)

(72) Inventor: Masato Nomiya, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 86 days.

(21) Appl. No.: 14/611,513

(22) Filed: Feb. 2, 2015

(65) Prior Publication Data

US 2015/0156868 A1     Jun. 4, 2015

Related U.S. Application Data

(63) Continuation of application No. PCT/JP2013/063698, filed on May 16, 2013.

(30) Foreign Application Priority Data

Aug. 13, 2012  (JP) ................. 2012-179236

(51) Int. Cl.
*H05K 1/00* (2006.01)
*H05K 1/02* (2006.01)
(Continued)

(52) U.S. Cl.
CPC ............ *H05K 1/0298* (2013.01); *H01G 4/012* (2013.01); *H01G 4/12* (2013.01); *H01G 4/30* (2013.01); *H05K 1/025* (2013.01); *H05K 1/0237* (2013.01); *H05K 1/0306* (2013.01); *H05K 1/092* (2013.01); *H05K 3/0067* (2013.01); *H05K 3/12* (2013.01); *H05K 3/4629* (2013.01); *H05K 1/162* (2013.01); *H05K 2201/0209* (2013.01);
(Continued)

(58) Field of Classification Search
CPC .. H05K 1/0298; H05K 3/4629; H05K 1/0237; H01G 4/30; H01G 4/012; H01G 4/12
USPC ................. 174/258, 250, 251, 253, 255–257
See application file for complete search history.

(56) References Cited

U.S. PATENT DOCUMENTS

2009/0218123 A1    9/2009  Yamamoto et al.

FOREIGN PATENT DOCUMENTS

| JP | H09-023067 A | 1/1997 |
| JP | 2002-158452 A | 5/2002 |

(Continued)

OTHER PUBLICATIONS

Written Opinion issued in Application No. PCT/JP2013/063698 dated Jul. 2, 2013.

*Primary Examiner* — Tremesha S Willis
(74) *Attorney, Agent, or Firm* — Pearne & Gordon LLP

(57) ABSTRACT

The electronic component of this invention includes a multilayer ceramic substrate 14 composed of a plurality of ceramic layers 12. A wiring electrode 16 and a planar electrode 18 are formed on a ceramic layer 12, which is an insulating layer. The planar electrode 18 is formed so as to be spaced apart from the wiring electrode 16 at the certain interval. An edge portion 22 is formed in a region of the planar electrode 18 adjacent to and spaced apart from the wiring electrode 16 at a certain interval. A central portion 20 is formed in a region of the planar electrode 18 other than the edge portion 22. At least the composition of the central portion 20 is different from the composition of the wiring electrode 16, and the composition of the edge portion 22 is the same as the composition of the wiring electrode 16.

5 Claims, 1 Drawing Sheet

(51) Int. Cl.

| | | |
|---|---|---|
| *H05K 3/46* | (2006.01) | |
| *H01G 4/30* | (2006.01) | |
| *H01G 4/012* | (2006.01) | |
| *H01G 4/12* | (2006.01) | |
| *H05K 1/03* | (2006.01) | |
| *H05K 3/00* | (2006.01) | |
| *H05K 3/12* | (2006.01) | |
| *H05K 1/09* | (2006.01) | |
| *H05K 1/16* | (2006.01) | |

(52) U.S. Cl.
CPC ............... *H05K 2201/0212* (2013.01); *H05K 2201/0352* (2013.01); *H05K 2201/0391* (2013.01); *H05K 2201/09336* (2013.01); *H05K 2201/09736* (2013.01)

(56) References Cited

FOREIGN PATENT DOCUMENTS

| | | |
|---|---|---|
| JP | 2005-019601 A | 1/2005 |
| JP | 2006-327064 A | 12/2006 |
| JP | 2007-250564 A | 9/2007 |
| WO | 2008-075521 A1 | 6/2008 |

ELECTRONIC COMPONENT AND MANUFACTURING METHOD THEREFOR

BACKGROUND OF THE INVENTION

Field of the Invention

The present invention relates to an electronic component including a ceramic substrate in which a wiring electrode and a planar electrode are formed on a surface of a ceramic layer, and to a manufacturing method therefor.

Description of the Related Art

It is disclosed that optimum impedance characteristics are achieved for both a general signal line and a differential signal line by efficiently arranging a power supply portion and a ground portion on a layer inside a multilayer ceramic substrate, which is an electronic component, described in Patent Document 1. One feature of this configuration is that a surface on which the differential signal line is arranged includes a first region in which the differential signal line is arranged and a second region in which either of a power supply plane and a ground plane is arranged. In other words, it is disclosed that the differential signal line, which is composed of a fine conductor pattern, and the power supply plane, which has a large surface area, are arranged on the same ceramic layer.

In general, when internal conductors are to be formed inside a multilayer ceramic substrate, in addition to a conductive component, for example, a metallic oxide or ceramic particles are added to a conductive paste in order to prevent the electrodes from becoming detached when firing is performed for example. A planar electrode having a large surface area is particularly at risk of becoming detached and therefore a larger amount of the above-mentioned additive may be added compared with a wiring electrode composed of a fine conductive pattern. Therefore, when a wiring electrode and a planar electrode are formed on the same ceramic layer as in the multilayer ceramic substrate described in Patent Document 1, screen printing is performed a plurality of times in order to print different conductive pastes on the same ceramic layer.

Patent Document 1: Japanese Unexamined Patent Application Publication No. 2002-158452

BRIEF SUMMARY OF THE INVENTION

However, as described above, conductive pastes having different compositions from each other are used for the wiring electrode and the planar electrode formed on the same ceramic layer, and therefore the plurality of printing operations have to be performed separately. Consequently, there has been a problem in that it is necessary to make the interval between the wiring electrode and the planar electrode wider than usual. In other words, since it has been necessary to perform printing using a plurality of screen printing plates, it has been necessary to provide an interval including a margin between the printing patterns in order to take into account the differences in such as the irregularities between the plates resulting from the plate making process. In addition, when printing is performed a plurality of times, it is also necessary to perform drying a plurality of times after the printing and therefore it has been necessary to provide a margin between the patterns of the wiring electrode and the planar electrode in order to accommodate the irregularities caused by the heat generated in the drying processes.

In addition, in an electronic component in which the wiring electrode and the planar electrode are manufactured using conductive pastes having different compositions, there has been a problem in that the linearity of the edges of the planar electrode is poor since a large amount of the additive is added to the planar electrode, and as a result the loss of the high frequency characteristics is large.

Accordingly, a main object of the present invention is to provide an electronic component that can be reduced in size by arranging a wiring electrode and a planar electrode having different compositions from each other on the same ceramic layer and whose high frequency characteristics are not degraded.

An electronic component of the present invention includes an insulator layer and a wiring electrode and a planar electrode formed on the insulator layer. The wiring electrode and the planar electrode are formed on the same insulator layer. At least a composition of a central portion of the planar electrode is different from a composition of the wiring electrode and a composition of an edge portion of the planar electrode which is adjacent to and spaced apart from the wiring electrode at a certain interval is the same as the composition of the wiring electrode.

In addition, in the electronic component of the present invention, it is preferable that the insulator layer be composed of a plurality of ceramic layers that are stacked on top of one another, that the wiring electrode and the planar electrode be arranged between the insulator layers, and that the planar electrode contain at least one selected from among a metal powder, a metal oxide, a ceramic powder and a resin powder other than a main component in a larger amount than the wiring electrode.

In addition, in the electronic component of the present invention, it is preferable that a thickness of the edge portion of the planar electrode be larger than a thickness of the central portion of the planar electrode.

In addition, in the electronic component of the present invention, it is preferable that an edge portion of the planar electrode, which is on an opposite side to the edge portion of the planar electrode with the central portion of the planar electrode interposed therebetween, have the same composition as the conductive paste of the wiring electrode.

In addition, an electronic component manufacturing method of the present invention includes a step of preparing ceramic green sheets, a step of printing a wiring electrode conductive paste and a planar electrode conductive paste on a surface of the same ceramic green sheet, a step of forming a wiring electrode and a planar electrode by drying the printed wiring electrode conductive paste and planar electrode conductive paste, a step of manufacturing a ceramic multilayer body by stacking the ceramic green sheets on top of one another and then subjecting the stacked ceramic green sheets to press bonding and a step of firing the ceramic multilayer body. The step of printing includes a step of simultaneously printing the wiring electrode conductive paste on a region where the wiring electrode is to be formed and in a region of the planar electrode that is adjacent to and spaced apart from the wiring electrode at a certain interval and a step of printing a remaining portion of the planar electrode on the ceramic green sheet.

According to the electronic component of the present invention, in an electronic component including a wiring electrode and a planar electrode formed on an insulating layer, the wiring electrode and the planar electrode are formed on the same insulating layer, at least a composition of a central portion of the planar electrode is formed so as to be different from a composition of the wiring electrode and a composition of an edge portion of the planar electrode which is adjacent to and spaced apart from the wiring electrode at a certain interval is formed so as to be the same as the composition of the wiring electrode and therefore size reduction can be achieved for the electronic component since an interval between the wiring electrode and the planar electrode can be formed to be the same as an interval would be in a case where two pieces of a wiring electrode are simultaneously formed. In addition, by increasing the linearity of an edge of the edge portion of the planar electrode while suppressing detachment of the planar electrode, an electronic component can be obtained whose high frequency characteristics are not degraded.

In addition, regarding the composition of the planar electrode in the electronic component of the present invention, the planar electrode contains at least one selected from among a metal powder, a metal oxide, a ceramic powder and a resin powder other than a main component in a larger amount than the wiring electrode and therefore an electronic component is obtained in which detachment of the planar electrode from the insulating layer can be suppressed.

Furthermore, in the electronic component of the present invention, the linearity of the edge portion of the planar electrode is further increased by making the thickness of the edge portion of the planar electrode be larger than the thickness of the central portion of the planar electrode and therefore an electronic component can be obtained in which the high frequency characteristics of the wiring electrode and the planar electrode of the electronic component are maintained.

In addition, in the electronic component of the present invention, an edge portion of the planar electrode, which is on an opposite side to the edge portion of the planar electrode with the central portion of the planar electrode interposed therebetween, is formed with the same composition as the conductive paste of the wiring electrode and therefore an electronic component can be obtained that has further improved high frequency characteristics.

In the electronic component manufacturing method of the present invention, the step of printing the wiring electrode conductive paste and the planar electrode conductive paste includes a step of simultaneously printing the wiring electrode conductive paste on a region where the wiring electrode is to be formed and in a region of the planar electrode that is adjacent to and spaced apart from the wiring electrode at a certain interval and a step of printing a remaining portion of the planar electrode on the ceramic green sheet, and therefore an electronic component can be obtained for which size reduction can be achieved since an interval between the wiring electrode and the planar electrode can be formed to be the same as an interval would be in a case where two pieces of a wiring electrode are simultaneously formed.

According to the present invention, an electronic component is obtained that can be reduced in size by arranging a wiring electrode and a planar electrode having different compositions from each other on the same ceramic layer and whose high frequency characteristics are not degraded.

The above-described object and other objects, characteristics and advantages of the present invention will become clearer from the following description of modes for carrying out the invention, which will be made with reference to the drawings.

DETAILED DESCRIPTION OF THE INVENTION

Figure 1:
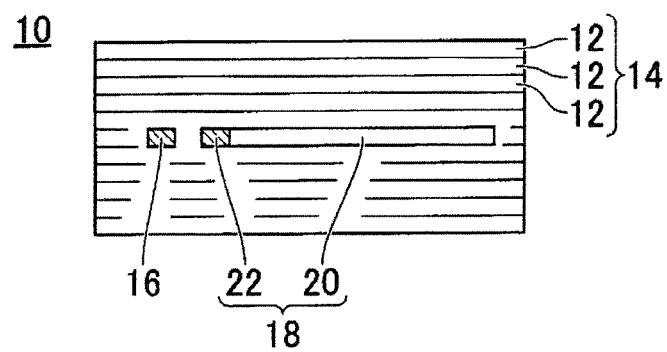
FIG. 1 is a sectional schematic diagram of a first embodiment of an electronic component of the present invention.

A first embodiment of an electronic component of the present invention will be described. FIG. 1 is a sectional schematic diagram of the first embodiment of the electronic component of the present invention. An electronic component 10 of the first embodiment includes ceramic layers 12, which are insulating layers. In addition, for example, the electronic component 10 includes a multilayer ceramic substrate 14 composed of a plurality of the ceramic layers 12. A wiring electrode 16 and a planar electrode 18 are formed on a surface of one of the ceramic layers 12.

The electronic component 10 of the first embodiment functions as the electronic component 10 when there is only the multilayer ceramic substrate 14 and functions as an electronic component module when an electronic component element (not illustrated) is mounted on the multilayer ceramic substrate 14.

The material of the ceramic layers 12 is preferably one including barium oxide, silicon oxide or alumina as a main component. In addition, instead of that, a material obtained by for example adding a glass component, which acts as a sintering additive, to a material acting as a ceramic filler such as alumina or barium titanate may be used as the material of the ceramic layers 12. However, in the case where a reducing atmosphere is necessary in the firing conditions due to the material characteristics of for example an electrode material to be described later, a composition that is not reduced when fired in the reducing atmosphere needs to be selected.

In the electronic component 10 of the first embodiment, the wiring electrode 16 and the planar electrode 18 are both formed on the same ceramic layer 12. The wiring electrode 16 is linearly formed on the ceramic layer 12. The planar electrode 18 is planarly formed and is spaced apart from the wiring electrode 16 at a certain interval. An edge portion 22 is formed in a region of the planar electrode 18 that is adjacent to and spaced apart from the wiring electrode 16 at the certain interval. A central portion 20 is formed in a region of the planar electrode 18 other than the edge portion 22 of the planar electrode 18.

In addition, the wiring electrode 16 and a part of the planar electrode 18 formed on the ceramic layer 12 are formed of different compositions. That is, at least the composition of the central portion 20 of the planar electrode 18 is different from the composition of the wiring electrode 16 and the composition of the edge portion 22 of the planar electrode 18, which is the region adjacent to and spaced apart from the wiring electrode 16 at the certain interval, is formed using the same composition as the wiring electrode 16.

It is preferable that the width of the wiring electrode 16 be 100 μm or less. If the width of the wiring electrode 16 is more than 100 μm, it becomes more likely that the parts of the wiring electrode 16 will become detached.

In addition, the width of the planar electrode 18 in the longitudinal and lateral directions is preferably 150 μm or more. Detachment is more likely to occur if an attempt is made to form a planar electrode whose width in either of the longitudinal and lateral directions of the planar electrode 18 is 150 μm or more using a wiring electrode conductive paste, and therefore the planar electrode 18 is formed using a conductive paste with which detachment is less likely to occur than with the wiring electrode conductive paste.

In addition, the edge portion 22 of the planar electrode 18, the edge portion 22 being formed using the same composition as the wiring electrode 16, preferably has a width of 200 μm or less from the edge of the planar electrode 18. If the width of the edge portion 22 of the planar electrode 18, the edge portion 22 being formed using the same composition as the wiring electrode 16, is formed so as to be 200 μm or less, it is possible to suppress the degradation of the characteristics and the disconnection risk of the wiring electrode 16. In addition, it is possible to reduce the occurrence of the detachment defects for the planar electrode 18 while reducing the interval between the wiring electrode 16 and the planar electrode 18 and maintaining the high frequency characteristics of the planar electrode 18.

On the other hand, if the width of the edge portion 22 of the planar electrode 18, the edge portion 22 being formed using the same composition as the wiring electrode 16, becomes larger than 200 μm, detachment is more likely to occur in the edge portion 22 of the planar electrode 18, the edge portion 22 being formed using the wiring electrode conductive paste.

As the wiring electrode conductive paste used to form the wiring electrode 16 and the edge portion 22 of the planar electrode 18, a conductive paste having Cu as a main component is used, but, other than Cu, it is particularly preferable that a conductive paste having a metal that is excellent in terms of electrical conductivity such as Ag, Au, Ni, Ag/Pd, Ag/Pt and so on as a main component be used.

In addition, in order to prevent the interlayer detachment in a firing process for example, it is preferable that at least one selected from other metal powders, metal oxide powders, ceramic powders and resin powders be added to a planar electrode conductive paste, which is used to form the central portion 20 of the planar electrode 18, in such an amount that reversal does not occur, so long as, under firing conditions of the ceramic green sheets that will become the ceramic layers 12, an unwanted reaction does not occur with the ceramic green sheets and melting does not occur during the firing. The shape, average particle diameter and particle size distribution of the conductive powder are not particularly limited, but it is preferable that the average particle diameter be around 0.1 to 10 μm and that the conductive powder not contain very large powder particles or very agglomerated powder particles.

In the case where the wiring electrode 16 and the planar electrode 18 are formed by performing printing a plurality of times using different conductive pastes, it has been necessary to provide a margin between the wiring electrode 16 and the planar electrode 18 in order to suppress a short circuit. In other words, this means that it has been necessary to set a design interval between the wiring electrode 16 and the planar electrode 18 to be larger and for example the design interval between the wiring electrode 16 and the planar electrode 18 has been set to 50 μm and as a result this has been a main factor impeding the size reduction of the multilayer ceramic substrates or the electronic components including a multilayer ceramic substrate. According to the electronic component 10 of the first embodiment, since the wiring electrode 16 and, out of the planar electrode 18, at least the edge portion 22, which is adjacent to and spaced apart from the wiring electrode 16 at the certain interval, of the planar electrode 18 are formed by being printed simultaneously, the same interval as in the case where two pieces of the wiring electrode 16 are simultaneously formed can be designed as the interval between the wiring electrode 16 and the planar electrode 18, that is, for example the interval between the wiring electrode 16 and the planar electrode 18 can be designed as 10 μm and as a result the size reduction can be achieved for the electronic component 10.

In addition, according to the electronic component 10 of the first embodiment, out of a peripheral portion of the planar electrode 18, the edge portion 22, which has a large effect on the high frequency characteristics, is formed using a conductive paste having the same composition as the wiring electrode 16, which is excellent in terms of high frequency characteristics, and therefore the linearity of the edge of the edge portion 22 of the planar electrode 18 can be increased. Consequently, the loss of high frequency characteristics can be suppressed even in the case where an additive other than the conductive component is added to the conductive paste for forming the planar electrode 18 in order to prevent the layer detachment. That specifically, if the edge portion 22, which greatly affects the high frequency characteristics of the electronic component 10, is formed using a conductive paste having the same composition as the wiring electrode which is excellent in terms of high frequency characteristics, the high frequency characteristics (IL: insertion loss) can be improved by 0.025 dB.

Figure 2:
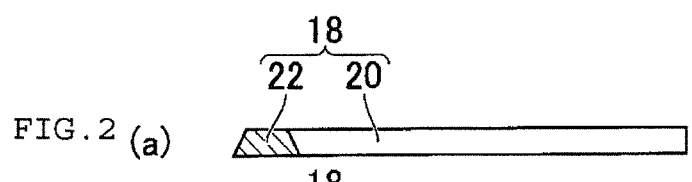
FIG. 2(a), FIG. 2(b) and FIG. 2(c) show sectional schematic diagrams illustrating various shapes of a planar electrode of the electronic component of the present invention illustrated in FIG. 1.
Figure 2:
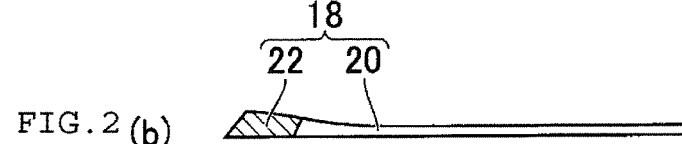
Figure 2:
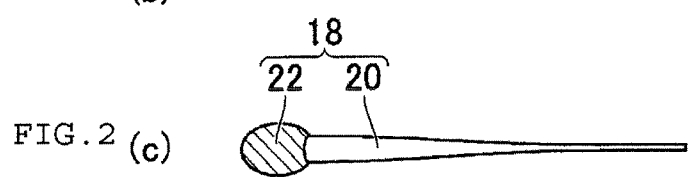

In addition, FIG. 2(a), FIG. 2(b) and FIG. 2(c) show sectional schematic diagrams illustrating various shapes of the planar electrode of the electronic component 10 of the first embodiment illustrated in FIG. 1. That is, FIG. 2(a), FIG. 2(b) and FIG. 2(c) are sectional schematic diagrams illustrating various sectional shapes of the planar electrode 18.

In FIG. 2(a), the sectional shape of the edge portion 22 of the planar electrode 18 is a substantially trapezoidal shape. In the planar electrode 18 illustrated in FIG. 2(a), the thickness of the central portion 20 and the thickness of the edge portion 22 are substantially the same. In addition, in FIG. 2(b), the sectional shape of the edge portion 22 of the planar electrode 18 is formed in a substantially trapezoidal shape. The angle of the edge of the edge portion 22 of the planar electrode 18 with respect to the ceramic layer 12 is formed so as to be at least greater than 45° and equal to or less than 90°. In addition, the thickness of the central portion 20 of the planar electrode 18 is formed so become smaller in the direction toward the edge portion on the opposite side to the edge portion 22. In addition, in FIG. 2(c), the sectional shape of the edge portion 22 of the planar electrode 18 is formed in a semicircular shape. The thickness of the central portion 20 of the planar electrode 18 is formed smaller in a wedge-like shape in the direction toward the edge portion on the opposite side to the edge portion 22.

As illustrated in FIG. 2(a), by forming the sectional shape of the edge portion 22 of the planar electrode 18 in a substantially trapezoidal shape, the linearity of the edge portion 22 is improved and therefore the high frequency characteristics of the electronic component 10 can be maintained. In addition, as illustrated in FIG. 2(b) and FIG. 2(c), the edge portion 22 of the planar electrode 18 is thick and the thickness of the central portion 20 of the planar electrode 18 is formed smaller in the direction toward the opposite side to the edge portion 22 and as a result the linearity of the edge portion 22 is further improved and therefore loss of the high frequency characteristics of the electronic component 10 can be further suppressed. That is, specifically, the high frequency characteristics (IL: insertion loss) of the electronic component can be improved by 0.030 dB.

Figure 3:
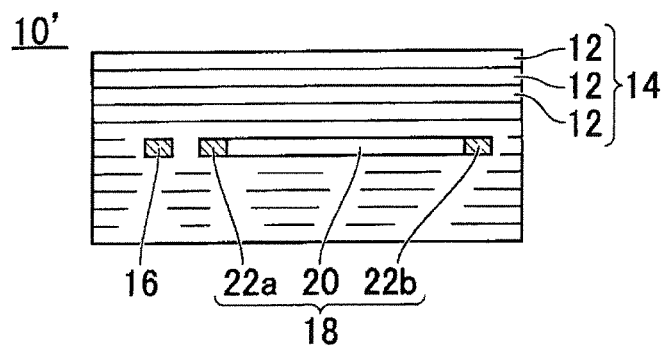
FIG. 3 is a sectional schematic diagram of a second embodiment of an electronic component of the present invention.

Next, a second embodiment of an electronic component of the present invention will be described. FIG. 3 is a sectional schematic diagram of the second embodiment of the electronic component of the present invention. An electronic component 10' of the second embodiment includes ceramic layers 12, which are insulating layers. In addition, for example, the electronic component 10' includes a multilayer ceramic substrate 14 composed of a plurality of the ceramic layers 12. A wiring electrode 16 and a planar electrode 18 are formed on a surface of one of the ceramic layers 12.

Similarly to the electronic component 10, the electronic component 10' of the second embodiment functions as the electronic component 10' when there is only the multilayer ceramic substrate 14 and functions as an electronic component module when an electronic component element (not illustrated) is mounted on the multilayer ceramic substrate 14.

In the electronic component 10' of the second embodiment, the wiring electrode 16 and the planar electrode 18 are both formed on the same ceramic layer 12. The wiring electrode 16 is linearly formed on the ceramic layer 12. The planar electrode 18 is planarly formed so as to be adjacent to and spaced apart from the wiring electrode 16 at a certain interval. An edge portion 22a is formed in a region of the planar electrode 18 that is adjacent to and spaced apart from the wiring electrode 16 at the certain interval. In addition, an edge portion 22b is formed in a region that is on the opposite side to the region of the planar electrode 18 that is adjacent to and spaced apart from the wiring electrode 16 at the certain interval. In the planar electrode 18, a central portion 20 is formed in a region of the planar electrode 18 other than the edge portion 22a and the edge portion 22b. That is, the edge portion 22b is formed so as to face the edge portion 22a with the central portion 20 interposed therebetween. The wiring electrode 16 and the central portion 20 of the planar electrode 18 are formed using different compositions. In addition, the wiring electrode 16 and the edge portion 22a and the edge portion 22b of the planar electrode 18 are formed using the same composition.

The material of the ceramic layers 12 of the electronic component 10' of the second embodiment is the same as the material used in the electronic component 10 of the first embodiment. In addition, the conductive paste used to form the wiring electrode 16 and the edge portion 22a and the edge portion 22b of the planar electrode 18 in the electronic component 10' of the second embodiment is the same as the wiring electrode conductive paste used in the electronic component 10 of the first embodiment. In addition, the conductive paste used to form the central portion 20 of the planar electrode 18 of the electronic component 10' of the second embodiment is the same as the planar electrode conductive paste used in the electronic component 10 of the first embodiment.

Along with exhibiting the same effect as the electronic component 10 of the first embodiment, the electronic component 10' of the second embodiment also exhibits the following effect.

That is, in the electronic component 10' of the second embodiment, the edge portion 22a is formed in a region of the planar electrode 18 that is adjacent to and spaced apart from the wiring electrode 16 at the certain interval. The edge portion 22b is formed in a region on the opposite side to the region of the planar electrode 18 that is adjacent to and spaced apart from the wiring electrode 16 at the certain interval. The edge portion 22a and the edge portion 22b are formed using the wiring electrode conductive paste and therefore the linearities of the respective edges of the planar electrode 18 can be increased and therefore an electronic component that has further improved high frequency characteristics can be obtained. Of course, an edge portion may be formed using the wiring electrode conductive paste around the whole periphery of the planar electrode 18.

Next, an embodiment of an electronic component manufacturing method of the present invention will be described.

First, ceramic green sheets that will become the ceramic layers 12 after firing are prepared. The ceramic green sheets can be sintered at a temperature of around 1000° C. For example, a ceramic material powder having barium oxide, silicon oxide or alumina as a main component is used as a material of the ceramic green sheets. In order to form a ceramic layer, a slurry is made in which the above-mentioned ceramic component is dispersed in a binder, then the slurry is molded on a carrier film using a doctor blade method for example, and thereby a ceramic green sheet is obtained. Through holes are formed in the obtained ceramic green sheet by performing laser processing from the carrier film side and the insides of the formed through holes are filled with a via filling conductive paste.

Instead of that, a material obtained by for example adding a glass component, which acts as a sintering additive, to a material acting as a ceramic filler such as alumina or barium titanate may be used for the ceramic green sheet. For example, borosilicate glass or silicon oxide may be added as the glass component. In addition, in the case where a reducing atmosphere is necessary in the firing conditions due to the material characteristics of an electrode material to be described later, it is necessary to consider selecting a composition that is not reduced when fired in the reducing atmosphere.

Next, the wiring electrode 16 and the planar electrode 18 are formed by printing the above-described wiring electrode conductive paste and planar electrode conductive paste into certain shapes on the surface of the above-described ceramic green sheet using for example a screen printing method as illustrated in FIG. 1 and then performing drying. The electrodes are formed by printing such that the interval between the wiring electrode 16 and the planar electrode 18 at that time is 10 μm for example. Then, an unfired ceramic multilayer body is obtained by stacking ceramic green sheets formed in the same way on top of one another and performing the press bonding using a certain mode and method. The desired electronic component including the multilayer ceramic substrate 14 is obtained by firing the ceramic multilayer body under the conditions appropriate for the conductor wiring layer and the ceramic layer components.

Here, for example, after printing and drying the planar electrode conductive paste in the region of the central portion 20 of the planar electrode 18, in the method of forming the wiring electrode 16 in the electronic component manufacturing method of this embodiment, the wiring electrode conductive paste is simultaneously printed and then dried on the region where the wiring electrode 16 is to be formed and at least the edge portion 22 of the planar electrode 18 that is adjacent to and spaced apart from the wiring electrode 16 at the certain interval out of the planar electrode 18, and thus the wiring electrode 16 and the planar electrode 18 are formed. Regarding the order in which the wiring electrode conductive paste and the planar electrode conductive paste are printed on the ceramic layer 12, either of the conductive pastes may be printed first.

The firing conditions used in the process of firing the ceramic multilayer body are not particularly limited and so long as the conditions are conditions under which the ceramic green sheets and the conductor wiring layer are sufficiently sintered, any known method can be used. However, care needs to be taken in the selection of the glass component in the case where a steady temperature region and a region in which the rate of temperature increase is markedly reduced are provided in specific temperature regions in the firing conditions in order to ensure that organic components included in the ceramic green sheets and the conductor wiring layer are sufficiently broken down. In the method of manufacturing the electronic component of the present invention, a steady temperature region may be provided in the range of 750 to 900° C. and 950 to 1000° C. in accordance with the firing conditions.

With the method of manufacturing the electronic component of this embodiment, the manufactured electronic component can be reduced in size because there is no need to provide an excessive margin for the design interval between the wiring electrode 16 and the planar electrode 18. This is because the electrodes are formed by being printed and dried simultaneously since the conductive paste used to form the wiring electrode 16 and the conductive paste used to form the edge portion 22 of the planar electrode 18 which is adjacent to and spaced apart from the wiring electrode 16 at the certain interval are formed using the same composition.

Next, an example of the electronic component and the electronic component manufacturing method of the present invention will be described.

In this example, first, an electronic component that includes ceramic layers that can be sintered at a temperature of 1000° C. or less and a multilayer ceramic substrate were manufactured using a wiring electrode conductive paste and a planar electrode conductive paste. In order to manufacture the ceramic layers, as the ceramic component, a mixed material having for example barium oxide, silicon oxide, alumina, boron oxide or calcium oxide as a main component was used for the ceramic layers.

In this example, a material having Cu as a main component was used as an inorganic component of the wiring electrode conductive paste. In addition, in this example, a conductive paste in which a ceramic powder used in the ceramic layers as an inorganic component is contained in a volume ratio of Cu:ceramic powder of 8:2 was used as the planar electrode conductive paste.

In order to form a ceramic layer, a slurry was made in which the above-mentioned ceramic component is dispersed in a binder, then the slurry was molded on a carrier film using a doctor blade method for example, and thereby a ceramic green sheet was obtained. Through holes were formed in the obtained ceramic green sheet by performing laser processing from the carrier film side and the insides of the formed through holes were filled with a via filling conductive paste.

Next, a wiring electrode and a planar electrode were formed by printing the above-described wiring electrode conductive paste and planar electrode conductive paste in certain shapes on the surface of the above-described ceramic green sheet using a screen printing method and then performing drying. That is, first, the planar electrode conductive paste is printed on the region of the central portion of the planar electrode and then dried. After that, the wiring electrode conductive paste was simultaneously printed and then dried on a region where the wiring electrode is to be formed and on a region of the planar electrode which is adjacent to and spaced apart from the wiring electrode at a certain interval. In this way, the wiring electrode and the planar electrode were formed. The electrodes were formed such that the interval between the wiring electrode and the planar electrode at that time was 10 μm. Then, an unfired ceramic multilayer body was obtained by stacking a plurality of ceramic green sheets formed in the same way on top of one another and performing press bonding using a certain manner and method. The desired electronic component including the multilayer ceramic substrate was obtained by firing the ceramic multilayer body under the conditions appropriate for the conductor wiring layer and the ceramic layer components. In this example, a steady temperature region was provided in the range of 750 to 900° C. and 950 to 1000° C. in accordance with the firing conditions.

In the case where the wiring electrode and the planar electrode are formed by performing printing a plurality of times using different conductive pastes, the design interval between the wiring electrode and the planar electrode has been set to 50 μm for example. However, as in this example, since a conductive paste having the same composition as the conductive paste used to form the wiring electrode is used in a region of the planar electrode that is adjacent to and spaced apart from the wiring electrode at a certain interval, the design interval can be set to the same design interval as in the case where two pieces of a wiring electrode are formed simultaneously. That is, the interval between the wiring electrode and the planar electrode can be designed to be 10 μm. Therefore, with the electronic component manufacturing method of this example, the interval between the wiring electrode and the planar electrode can be made smaller and therefore as a result the size reduction can be achieved for the electronic component.

In addition, regarding the electronic component obtained in this example, the edge portion of the planar electrode that greatly affects the high frequency characteristics out of the peripheral portion of the planar electrode is formed using a conductive paste having the same composition as the wiring electrode which is excellent in terms of high frequency characteristics and therefore an electronic component can be obtained in which the loss of high frequency characteristics is suppressed even in the case where an additive other than the conductive component is added to the conductive paste for forming the planar electrode from the viewpoint of preventing layer detachment.

The electronic component of this embodiment is an electronic component that includes a multilayer ceramic substrate formed of a plurality of ceramic layers, but the invention is not limited to this.

10, 10' electronic component
12 ceramic layer
14 multilayer ceramic substrate
16 wiring electrode
18, 18' planar electrode
20 central portion
22 edge portion
22a first edge portion
22b second edge portion

The invention claimed is:

1. An electronic component comprising:
   insulator layers; and
   a wiring electrode and a planar electrode formed on one of the insulator layers,
   wherein the wiring electrode and the planar electrode are formed on a same one of the insulator layers, the planar electrode comprises an edge portion adjacent to and spaced apart from the wiring electrode at a certain interval and a central portion other than the edge portion, at least a composition of the central portion of the planar electrode is different from a composition of the wiring electrode, and a composition of the edge portion of the planar electrode is a same as the composition of the wiring electrode.

2. The electronic component according to claim 1, wherein the insulator layers comprise a plurality of laminated ceramic layers, the wiring electrode and the planar electrode are arranged between the insulator layers, and the planar electrode contains at least one selected from among a metal powder, a metal oxide, a ceramic powder and a resin powder other than a main component in a larger amount than the wiring electrode.

3. The electronic component according to claim 1, wherein a thickness of the edge portion of the planar electrode is larger than a thickness of the central portion of the planar electrode.

4. An electronic component comprising: insulator layers; and a wiring electrode and a planar electrode formed on one of the insulator layers, wherein the wiring electrode and the planar electrode are formed on a same one of the insulator layers, the planar electrode comprises a first edge portion adjacent to and spaced apart from the wiring electrode at a certain interval, a second edge portion located on an opposite side to the first edge portion and a central portion other than the first edge portion and the second edge portion and interposed between the first edge portion and the second edge portion, and at least a composition of the central portion of the planar electrode is different from a composition of the wiring electrode, and a composition of each of the first edge portion and the second edge portion is a same as the composition of the wiring electrode.

5. The electronic component according to claim 2, wherein a thickness of the edge portion of the planar electrode is larger than a thickness of the central portion of the planar electrode.

* * * * *